(12) United States Patent
Hasegawa et al.

(10) Patent No.: US 7,570,053 B2
(45) Date of Patent: Aug. 4, 2009

(54) NMR MEASUREMENT METHOD

(75) Inventors: Kenichi Hasegawa, Tokyo (JP);
Kentarou Mizuno, Tokyo (JP);
Takahiro Anai, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 12/034,445

(22) Filed: Feb. 20, 2008

(65) Prior Publication Data

US 2008/0150527 A1 Jun. 26, 2008

Related U.S. Application Data

(60) Continuation of application No. 11/788,515, filed on Apr. 20, 2007, now abandoned, which is a division of application No. 11/475,593, filed on Jun. 27, 2006, now Pat. No. 7,245,126, which is a division of application No. 10/821,189, filed on Apr. 8, 2004, now Pat. No. 7,112,963.

(30) Foreign Application Priority Data

Apr. 11, 2003 (JP) .............................. 2003-107251

(51) Int. Cl.
*G01V 3/00* (2006.01)
(52) U.S. Cl. ....................... 324/309; 324/307
(58) Field of Classification Search ......... 324/300–322; 600/407–422; 333/101–103; 128/653.5, 128/899; 340/825.79
See application file for complete search history.

(56) References Cited

U.S. PATENT DOCUMENTS

| 4,652,824 | A | 3/1987 | Oppelt |
| 5,343,149 | A | 8/1994 | Hanawa |
| 5,365,171 | A | 11/1994 | Buess et al. |
| 5,481,190 | A | 1/1996 | Sugiura |
| 5,814,992 | A | 9/1998 | Busse-Grawitz et al. |
| 5,889,456 | A | 3/1999 | Triebe et al. |
| 6,280,441 | B1 | 8/2001 | Ryan |
| 6,437,570 | B2 | 8/2002 | Marek |
| 6,677,751 | B1* | 1/2004 | Marek et al. ................. 324/318 |
| 6,812,698 | B1 | 11/2004 | Tsukamoto |
| 6,841,999 | B2 | 1/2005 | Arneth et al. |
| 7,245,126 | B1* | 7/2007 | Hasegawa et al. ............ 324/315 |
| 2005/0197077 | A1* | 9/2005 | Bielmeier et al. ......... 455/115.1 |
| 2007/0194789 | A1* | 8/2007 | Hasegawa et al. ............ 324/313 |

FOREIGN PATENT DOCUMENTS

| JP | 4-158838 | 4/1992 |
| JP | 11-253416 | 11/1999 |

* cited by examiner

*Primary Examiner*—Brij B Shrivastav
(74) *Attorney, Agent, or Firm*—The Webb Law Firm

(57) ABSTRACT

There is disclosed an NMR measurement method and NMR apparatus in which the temperature of the NMR detection coil or the RF irradiation coil hardly varies if pulsed RF power is applied to the coil during NMR measurements. The apparatus includes the detection coil or the RF irradiation coil, a first RF power application means for applying RF power of a frequency necessary for measurement of NMR signals, a second RF power application means for applying RF power of a frequency not affecting the measurement of NMR signals, and a control means for controlling the two power application means such that the sum of the RF power applied to the coil from the first application means and the RF power applied to the coil from the second application means is kept almost constant.

4 Claims, 13 Drawing Sheets

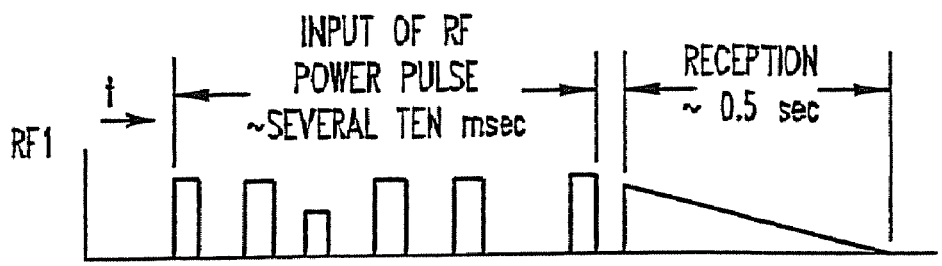
FIG. 7(a)
FIG. 7(b)
FIG. 7(c)
FIG. 7(d)

AN EXPANDED VIEW OF
THE NMR DETECTION COIL

A CROSS-SECTIONAL
VIEW OF THE COIL

NMR MEASUREMENT METHOD

CROSS REFERENCE TO RELATED APPLICATIONS

This application is a continuation of U.S. application Ser. No. 11/788,515, which is a division of U.S. application Ser. No. 11/475,593, now U.S. Pat. No. 7,245,126, which is a division of application Ser. No. 10/821,189, now U.S. Pat. No. 7,112,963.

BACKGROUND OF THE INVENTION

1. Field of the Invention

The present invention relates to an NMR measurement method and NMR apparatus and, more particularly, to an NMR measurement method and NMR apparatus using a detector assembly that is cooled to a cryogenic temperature by low-temperature helium gas to thereby enhance the sensitivity with which NMR signals are detected.

2. Description of Related Art

In an NMR apparatus, a strong static magnetic field is applied to a sample to induce a precessional motion of the magnetic moment of each atomic nucleus having a nuclear spin within the sample about the direction of the static field. Under this condition, an RF magnetic field is applied perpendicularly to the direction of the static field to induce a precessional motion of the magnetic moment of the atomic nucleus. Then, an NMR signal released when the precessional motion of the magnetic moment of the atomic nucleus returns to ground state from an excited state is observed as an RF magnetic field having a frequency intrinsic to the sample.

Usually, NMR signals are quite feeble and so attempts have been made to increase the detection sensitivity of the NMR apparatus. See Japanese Patent Laid-Open No. H10-307175, Japanese Patent Laid-Open No. H10-332801, and Japanese Patent Laid-Open No. 2001-153938. In particular, an NMR probe having a built-in detector is fitted with piping for circulating low-temperature gas. Thermal noise in the NMR apparatus is reduced by cryogenically cooling the detector, thus achieving gains in sensitivity.

The positional relation between the prior art NMR probe and a superconducting magnet producing a static magnetic field is shown in FIG. 1, where the superconducting magnet is indicated by A. A main coil B of superconducting wire is wound inside the superconducting magnet A. Normally, the main coil B is placed in an adiabatic vessel (not shown) capable of holding liquid helium or the like therein and is cooled to a cryogenic temperature. A nuclear magnetic resonance (NMR) probe C is made up of a jaw-like base portion placed outside the magnet and a cylindrical portion inserted inside the magnet. The superconducting magnet A is provided with a cylindrical hole D extending along the center axis of the magnet. The cylindrical portion is usually inserted into the hole D in the upward direction from its lower opening.

An example of structure of the prior art NMR probe is shown in FIG. 2. This example of structure is a low-temperature probe, known as a cooling probe. A probe container 8 is connected with a cryogenic cooling system 14 by a transfer line 9. The inside of each of the probe containers 8 and cooling system 14 is evacuated for thermal insulation from the outside. A detector assembly 1 consisting of a detector coil and a tuning-and-matching circuit is placed in the probe container 8. The detector assembly 1 is in thermal contact with a heat exchanger 2 and can be cooled. A heater 100 is mounted near the detector assembly 1 to control the temperature of the detector assembly 1.

The detector assembly 1 detects a nuclear magnetic resonance and produces an output signal. This signal is applied to a head amplifier 3 via a cable 6 and amplified. The output signal from the head amplifier 3 is sent to a spectrometer (not shown) via a cable 7. The head amplifier 3 is in thermal contact with a heat exchanger 4 and can be cooled. A heater 5 is mounted close to the head amplifier 3 to provide temperature control of the head amplifier 3.

The detector assembly 1 has a structure that permits a sample to be entered from outside of the probe container 8. Since this structure is not associated with the cooling, it is not shown.

The cryogenic cooling system 14 has a first cooling stage 20 and a second cooling stage 22. A cryocooler 19, such as a Gifford-McMahon cryocooler, is mounted in the cooling system 14. Heat exchangers 21 and 23 are mounted in the first cooling stage 20 and second cooling stage 22, respectively. Furthermore, heat exchangers 24 and 25 are mounted in pipes 15 and 16, respectively. Pipes 17 and 18 for supplying a working gas are connected with the cryocooler 19. The transfer line 9 has pipes 10, 11, 12, and 13 therein. The pipes 10-11 are connected with the heat exchanger 2, whereas the pipes 12-13 are connected with the heat exchanger 4.

The operation of this apparatus is next described. The working gas (helium gas) is supplied from an external compressor (not shown) via the pipes 17 and 18 to operate the cryocooler 19. Besides, a refrigerant consisting of helium gas is supplied from the pipe 16 and passed through the heat exchanger 24. Then, the refrigerant is cooled by the heat exchanger 21 in the first cooling stage 20. Furthermore, the refrigerant passes through the heat exchanger 25 and reaches the heat exchanger 23 in the second cooling stage 22, where the helium gas is cooled further. At this time, the temperature of the gas is 10 K.

The cooled helium gas is supplied into the heat exchanger 2 in the pipe 10 within the transfer line 9, thus cooling the detector assembly 1. The temperature of the gas immediately prior to entering the heat exchanger 2 is 15 K. The temperature of the gas just leaving the heat exchanger 2 is 23 K. This temperature rise is caused by reception of the heat from the detector assembly 1 and by heating by means of the heater 100 operating to control the temperature of the detector assembly 1.

Because the detector coil and tuning-and-matching circuit received in the detector assembly 1 are cooled, the Q value improves and the thermal noise decreases. Consequently, the sensitivity is improved. The helium gas returns to the cooling system 14 through the pipe 11 and precools the helium gas on the outward route by the heat exchanger 25. The gas is increased to a temperature of 40 K and then supplied to the heat exchanger 4 via the pipe 12. The gas cools the head amplifier 3 and improves the noise factor (NF) of the head amplifier 3. Consequently, the output signal from the detector assembly 1 can be transferred to the spectrometer (not shown) via the cable 7 without deteriorating the signal-to-noise ratio (S/N).

The head amplifier 3 is maintained at an appropriate temperature by the heater 5. The temperature of the gas immediately prior to entering the heat exchanger 4 is 40 K. The temperature of the gas just leaving the heat exchanger 4 is 90 K. This temperature rise is caused by reception of heat from the head amplifier 3 and by being heated by the heater 5 operating to control the temperature of the head amplifier 3.

The helium gas returns to the cooling system 14 via the pipe 13 within the transfer line 9 and precools the helium gas on the outward route by means of the heat exchanger 24.

Then, the gas passes through the pipe 15 and returns into the external compressor (not shown). In this way, the gas is circulated.

The structure of an NMR detector assembly positioned at the front end of the prior art NMR probe is shown in FIG. 3. This assembly has a vacuum-insulated container 8 in which a heat exchanger 2 (cryocooler) is supported by pillars 101. The detector assembly made up of an NMR detection coil 33 and a tuning-and-matching circuit 36 is in thermal contact with the heat exchanger 2 (cryocooler) via a cooling stage 34 and made stationary. The NMR detection coil 33 is wound along the outer periphery of a cylindrical bobbin (not shown). The center of detection of the detection coil 33 is set at a position where the magnetic field homogeneity is maximal within the external static magnetic field applied from a superconducting magnet (not shown).

The NMR signal detected by the NMR detection coil 33 is pulled out via a lead 35 and sent to the external spectrometer (not shown) through the tuning-and-matching circuit 36, cable 6, head amplifier 3, and cable 7.

The pipes 10 and 11 for injecting and discharging low-temperature refrigerant, such as low-temperature helium gas, are connected with the heat exchanger 2 (cryocooler). The cooling stage 34 is in thermal contact with the heat exchanger 2 (cryocooler) and has a thermometer 26 and the heater 100 for regulating the temperature. The cooling stage 34 is appropriately heated by the heater 100 while detecting the temperature of the stage 34. A pipe 31 for a gas for varying the sample temperature extends along the center axis of the detection coil 33. This gas is blown in the upward direction through the gas pipe 31.

A sample tube 40 is inserted in the downward direction further into the gas pipe 31 for varying the sample temperature and positioned coaxially with the gas pipe 31 such that the center of the sample 40 is coincident with the center of detection of the detection coil 33.

In this configuration, the low-temperature refrigerant, such as low-temperature helium gas, is injected from the outside into the heat exchanger 2 (cryocooler) via the pipe 10, thus cooling the NMR detection coil 33 and tuning-and-matching circuit 36. This improves the Q value of the detection coil 33 and reduces thermal noise in the coil 33 and tuning-and-matching circuit 36. In consequence, the sensitivity of the NMR apparatus is improved. At the same time, a temperature-controlled gas is injected from below into the gas pipe 31 for varying the sample temperature, in order to maintain the sample tube 40 at an appropriate temperature.

The structure of an NMR detection coil assembly using a saddle coil is shown in FIGS. 4(a)-4(d). This is one example of the prior art NMR detection coil 33. FIG. 4(a) is a perspective view of the detection coil assembly, showing the manner in which the coil assembly has been completed. FIG. 4(b) shows the components. FIG. 4(c) is a vertical cross section of the coil assembly. FIG. 4(d) is an expanded view of the coil foil.

In FIG. 4(a), coil foil 37 assumes a form as shown in FIG. 4(d) and is wound on the outermost side of a cylindrical detector assembly. The coil foil 37 is formed by stamping metal foil. This coil foil 37 is provided with two rectangular windows. A narrow cutout extends downward from the center of the bottom side of each window to the outer bottom side of the coil foil 37. That is, the narrow cutout extends along the central vertical axis of each window.

This coil foil 37 is wound into a cylindrical form. As a result, a saddle coil having several portions is formed. That is, a cylindrical annular portion is formed in an upper portion. Two vertical band portions extending axially of the cylinder and having upper ends connected with the annular portion are formed in an intermediate portion. Four winged portions consisting of two opposite pairs of arc-shaped portions are formed in a lower portion.

A coil bobbin 32 made of a cylindrical dielectric is placed immediately inside of the coil foil 37. This coil foil 37 is held on the outer surface of the coil bobbin 32. Thus, the shape of the detection coil is maintained.

A cylindrical conductor 38 in the form of a cylindrical band is placed inside the annular portion made of the coil foil 37. Another cylindrical conductor 39 also in the form of a cylindrical band is placed inside the winged portions of the coil foil 37. The cylindrical conductor 38 and the annular portion of the coil foil 37 are opposite to each other with the coil bobbin 32 therebetween. Also, the cylindrical conductor 39 and the winged portions of the coil foil 37 are opposite to each other with the coil bobbin 32 therebetween.

The cylindrical winged portions of the coil foil 37, the coil bobbin 32 made of the cylindrical dielectric, and the cylindrical conductor 39 made of the cylindrical band together form first and second capacitors. The annular portion of the coil foil 37 and the two vertical band portions together form an inductor. In this way, an LC resonator capable of resonating with radio-frequency signals is formed.

The sample tube 40 holding a sample therein is inserted to the inside of the cylindrical conductors 38 and 39 along the center axis of the cylindrical detector assembly.

RF magnetic fields are produced in the windows of the coil foil 37 vertically to the plane of the paper. The cylindrical conductors 38 and 39 act as shields against the produced RF fields. The ranges irradiated with the RF fields are so limited that the RF magnetic fields apply only to a desired region of the inserted sample.

The prior art low-temperature cooled NMR probe has one problem. In the NMR instrument, during measurement of an NMR signal, pulsed RF power is applied to the NMR detection coil within the probe to excite nuclear spins within the sample. When the applied RF power flows as an RF current on the surface of the NMR detection coil, the current is converted into heat by the electrical resistance intrinsic to the material of the NMR detection coil. This increases the temperature of the detection coil itself.

FIG. 5 is a schematic diagram showing the RF power applied to the NMR detection coil and variations in the temperature of the coil. The top portion of the figure shows one example of the RF power applied to the NMR detection coil. In this example, six RF pulses of various magnitudes are applied to the detection coil for a period on the order of tens of milliseconds. After a lapse of a given time from the application, an NMR signal, known as a free induction decay (FID) signal, is detected for a period of about 0.5 second from the application of the RF pulse sequence.

The bottom portion of the figure shows variations in the temperature of the NMR detection coil during this time interval. The NMR detection coil is cooled to a low temperature of about 25 K by the cryocooler through which low-temperature helium gas is circulated. However, the cooling capability is limited. Furthermore, there is a thermal resistance between the cryocooler and the detection coil. Therefore, if pulsed RF power is applied to the detection coil, the coil shows an electrical resistance against the RF current and thus produces heat. Consequently, the low temperature can no longer be maintained. The temperature rises close to 30 K in a short time.

When the temperature increases, the electrical resistance of the metal material forming the NMR detection coil increases. This varies the Q value of the coil. Concomitantly, the matching condition is varied. As a result, RF magnetic fields of desired intensity cannot be produced within the detection coil. Nuclear spins within the sample cannot be excited normally.

This problem produces an adverse effect during reception of an NMR signal, as well as during excitation of nuclear spins. That is, during reception of an NMR signal, it is impossible to maintain the temperature of the NMR detection coil constant and so neither the Q value of the coil nor the matching condition is kept constant. Hence, normal NMR signals cannot be obtained.

Temperature variations occurring in a quite short time as described above cannot be controlled by the method consisting of correcting the temperature, using the thermometer 26 and heater 100 mounted on the cooling stage 34, for the following reasons. There exists a thermal resistance between the NMR detection coil 33 generating heat and the thermometer 26. Each of the coil 33 and thermometer 26 has a thermal capacity. As a result, the response time of the temperature control between the coil 33 and thermometer 26 has a relatively large time constant. Accordingly, if the temperature detected by the thermometer 26 is controlled to be constant, it is not assured that the temperature of the detection coil 33 itself is kept constant. The similar problem will also occur at the provided RF irradiation coils.

SUMMARY OF THE INVENTION

In view of the foregoing, it is an object of the present invention to provide an NMR measurement method and NMR apparatus for performing an NMR measurement in such a way that if pulsed RF power is applied to the NMR detection coil or the RF irradiation coil, the temperature of the coils hardly varies.

An NMR measurement method according to the present invention for achieving the above-described object consists of applying RF power of a frequency not affecting measurement of NMR signals to the detection coil or the RF irradiation coil complementarily.

In one feature of the present invention, the detection coil or the RF irradiation coil has a resonance mode which is different from the resonance mode at the measurement frequency for an NMR signal and which does not affect the measurement of the NMR signal.

In another feature of the present invention, the aforementioned frequency which does not affect the measurement of the NMR signal can resonate in the same resonance mode as the measurement frequency for the NMR signal and is shifted from the measurement frequency for the NMR signal by a given frequency.

In a further feature of the present invention, the total amount of RF power applied to the detection coil or the RF irradiation coil is controlled so as not to substantially differ irrespective of whether the RF power of the frequency necessary for the measurement of the NMR signal is being applied or not.

In an additional feature of the present invention, the RF power having the frequency not affecting the measurement of the NMR signal is applied to the detection coil or the RF irradiation coil. An increase in the temperature of the detection coil or the RF irradiation coil is detected from the strength of the reflected RF power.

In still another feature of the present invention, the detection coil or the RF irradiation coil has a resonance mode which is different from the resonance mode at the measurement frequency for the NMR signal and which does not affect the measurement of the NMR signal.

In yet another feature of the present invention, the aforementioned frequency not affecting the measurement of the NMR signal can resonate in the same resonance mode as the measurement frequency for the NMR signal and is shifted from the measurement frequency for the NMR signal by a given frequency.

In a still additional feature of the present invention, the RF power of the frequency not affecting the measurement of the NMR signal can be so adjusted that the ratio of the RF power reflected from the detection coil or the RF irradiation coil to the RF power applied to the detection coil or the RF irradiation coil is minimized.

An NMR apparatus according to the present invention comprises: a detection coil or the RF irradiation coil; first RF power application means for applying RF power having a frequency necessary for measurement of an NMR signal to the detection coil or the RF irradiation coil; and second RF power application means for applying RF power having a frequency not affecting the measurement of the NMR signal to the detection coil or the RF irradiation coil.

In one feature of the present invention, the detection coil or the RF irradiation coil has a resonance mode which is different from the resonance mode at the measurement frequency for the NMR signal and which does not affect the measurement of the NMR signal.

In another feature of the present invention, the aforementioned frequency which does not affect the measurement of the NMR signal can resonate in the same resonance mode as the measurement frequency for the NMR signal and is shifted from the measurement frequency for the NMR signal by a given frequency.

In a further feature of the present invention, there is further provided control means for controlling the two RF power application means such that the sum of the RF power applied to the detection coil or the RF irradiation coil from the first RF power application means and the RF power applied to the detection coil or the RF irradiation coil from the second RF power application means is kept almost constant.

In an additional feature of the present invention, there is provided a power meter for detecting the ratio of the RF power reflected from the detection coil or the RF irradiation coil to the RF power applied to the detection coil or the RF irradiation coil from the second RF power application means.

In a still additional feature of the present invention, the RF power applied from the second RF power application means can be adjusted based on the value of the power meter such that the reflected RF power is minimized.

Other objects and features of the invention will appear in the course of the description thereof, which follows.

BRIEF DESCRIPTION OF THE DRAWINGS

FIGS. 7(a)-7(d) are time cycle diagrams illustrating an NMR measurement method according to one embodiment of the present invention;

DESCRIPTION OF THE PREFERRED EMBODIMENTS

Figure 1:
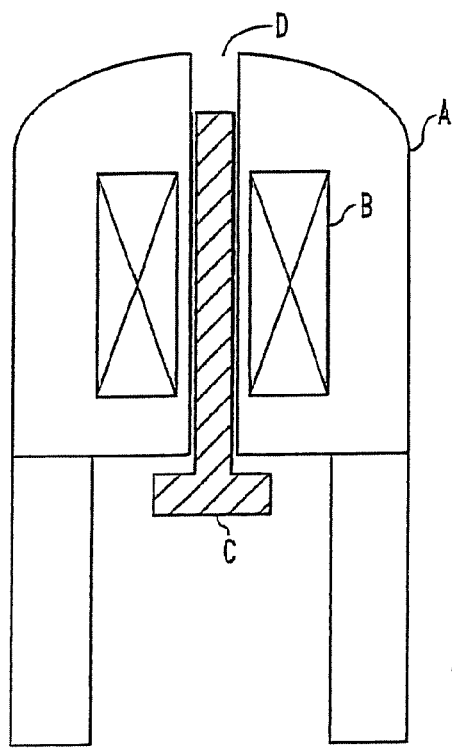
FIG. 1 is a schematic view of the prior art NMR apparatus.
Figure 2:
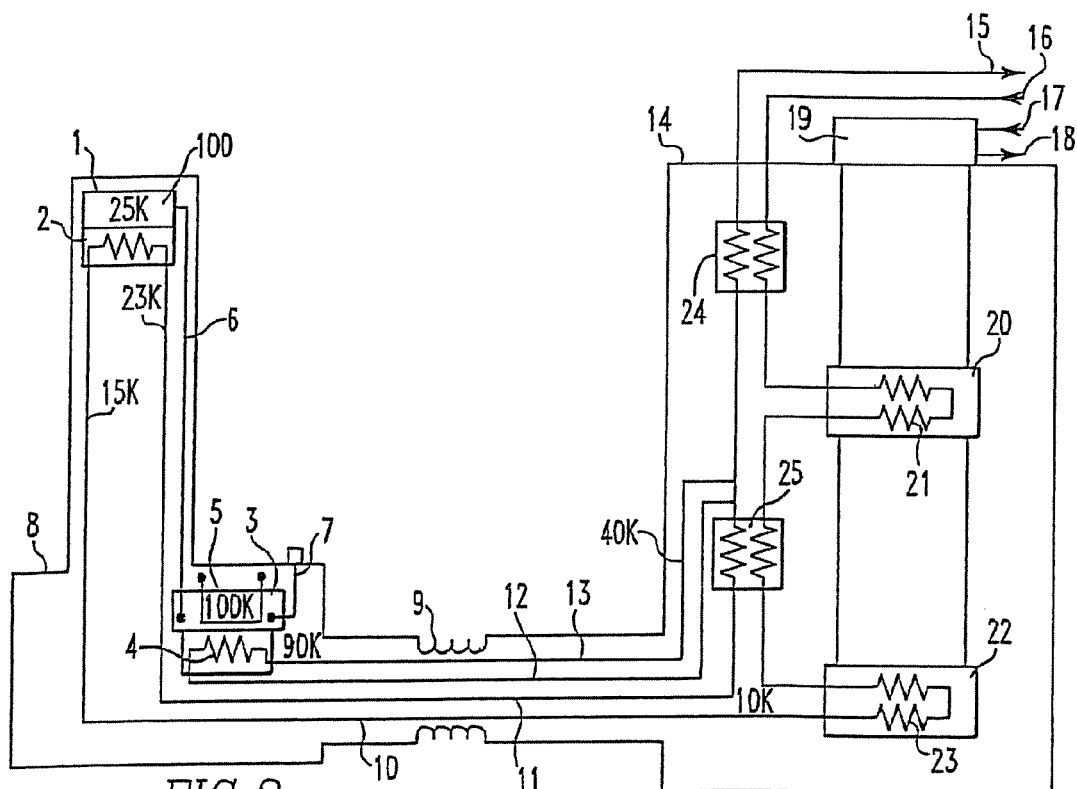
FIG. 2 is a view showing the structure of the prior art NMR cryogenic probe.
Figure 3:
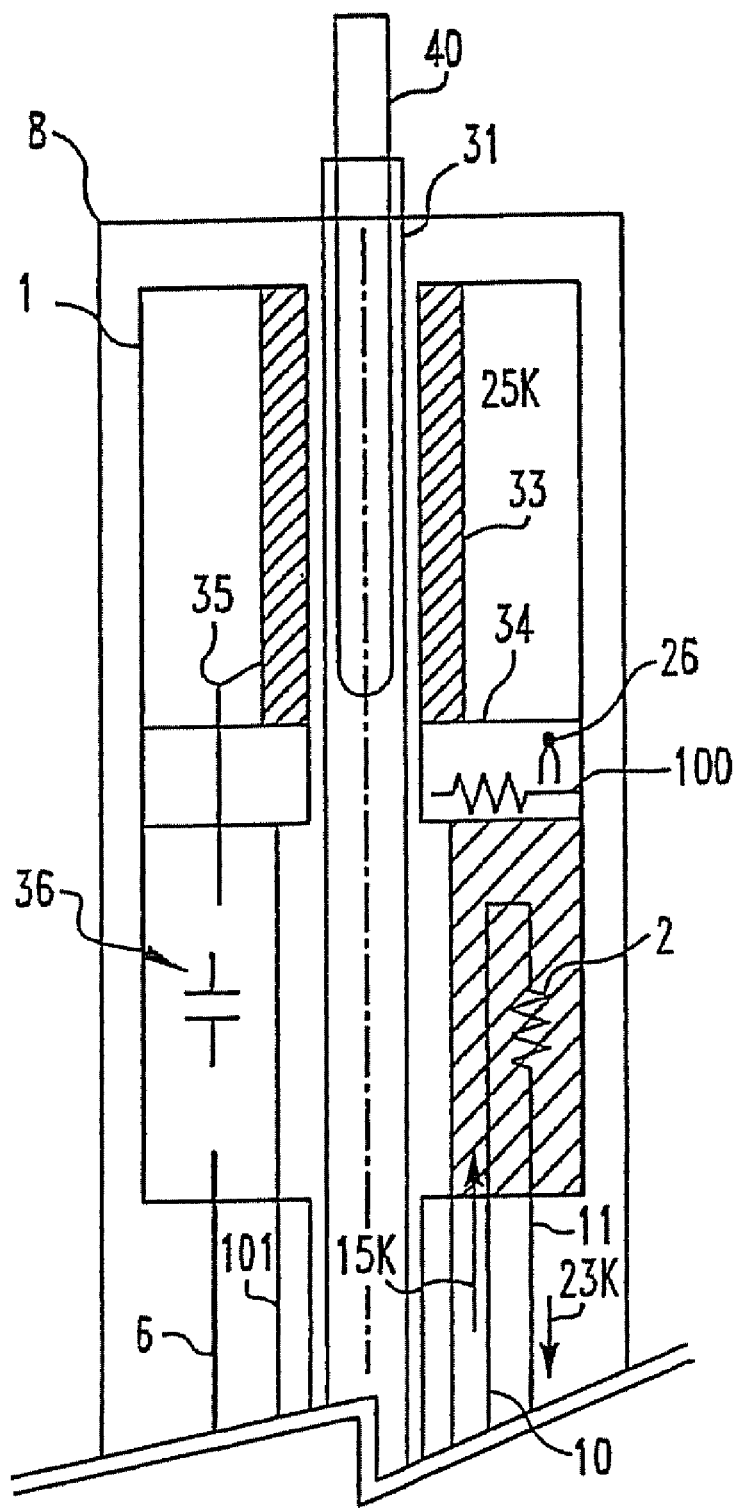
FIG. 3 is a cross-sectional view showing the structure of the prior art NMR detector assembly.
Figure 4A:
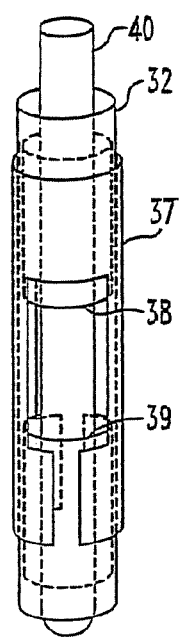
FIGS. 4(*a*)-4(*d*) show the structure of the prior art NMR detector assembly, more specifically, FIG. 4(*a*) is an assembled perspective view, FIG. 4(*b*) is an exploded perspective view, FIG. 4(*c*) is a sectioned view of the detector, and FIG. 4(*d*) is a view of an unwrapped coil foil.
Figure 4B:
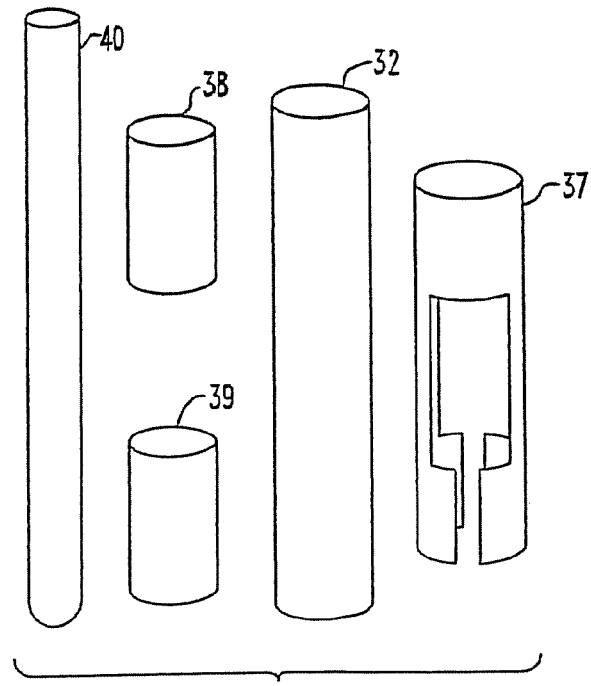
Figure 4C:
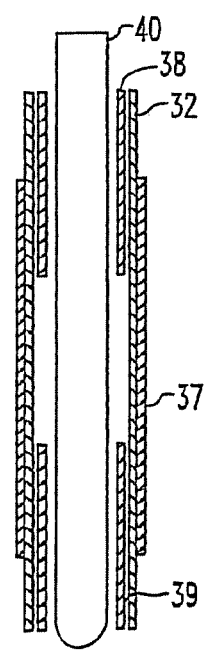
Figure 4D:
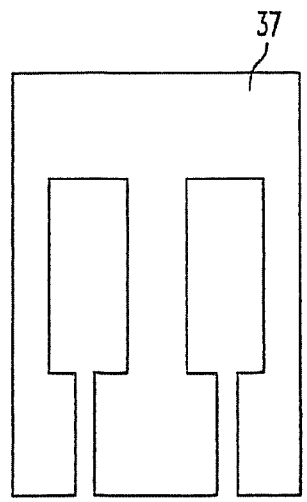
Figure 5:
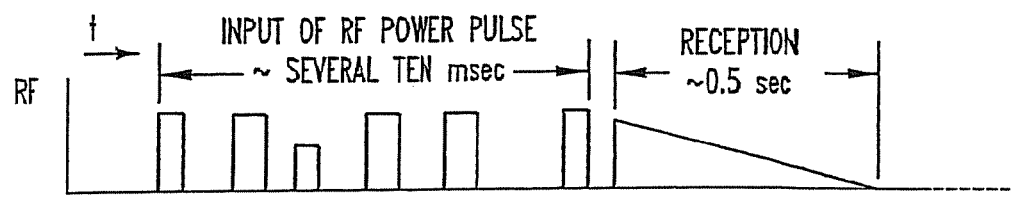
FIG. 5 is a diagram showing temperature variations of the prior art NMR detection coil assembly versus time and compared to the RF pulse and FID cycle.
Figure 5:
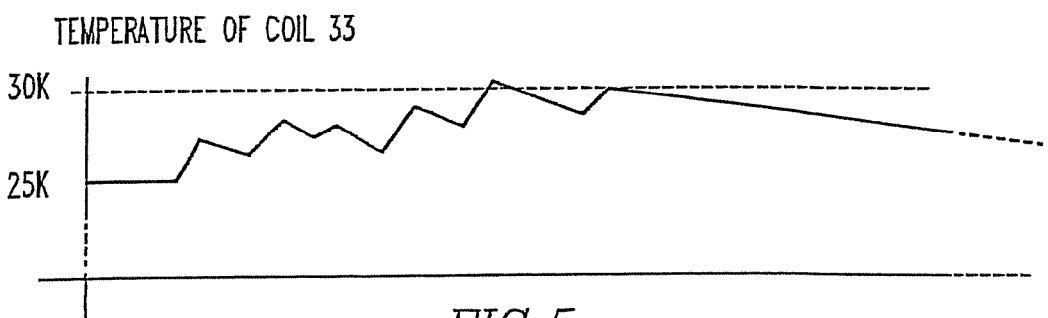
Figure 6A:
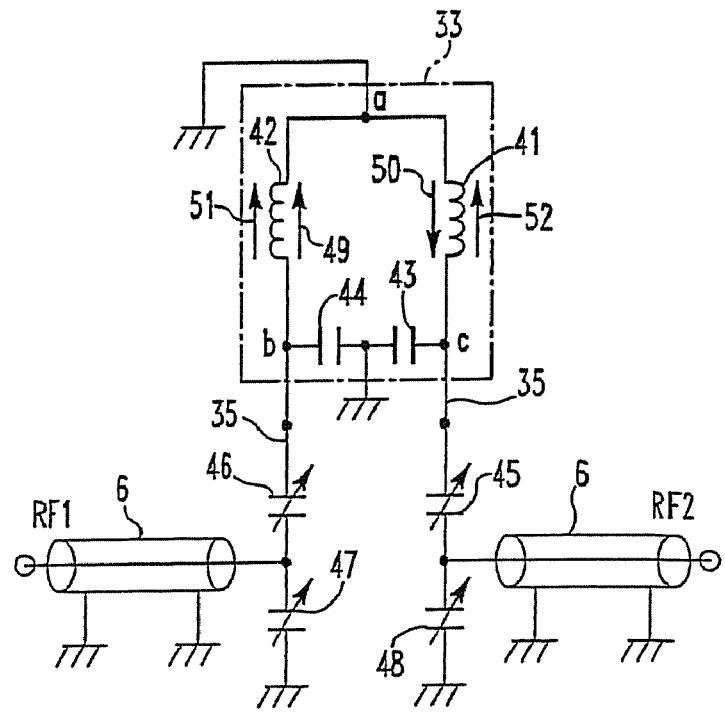
FIGS. 6(*a*) and 6(*b*) are diagrams of an NMR apparatus according to one embodiment of the present invention.
Figure 6B:
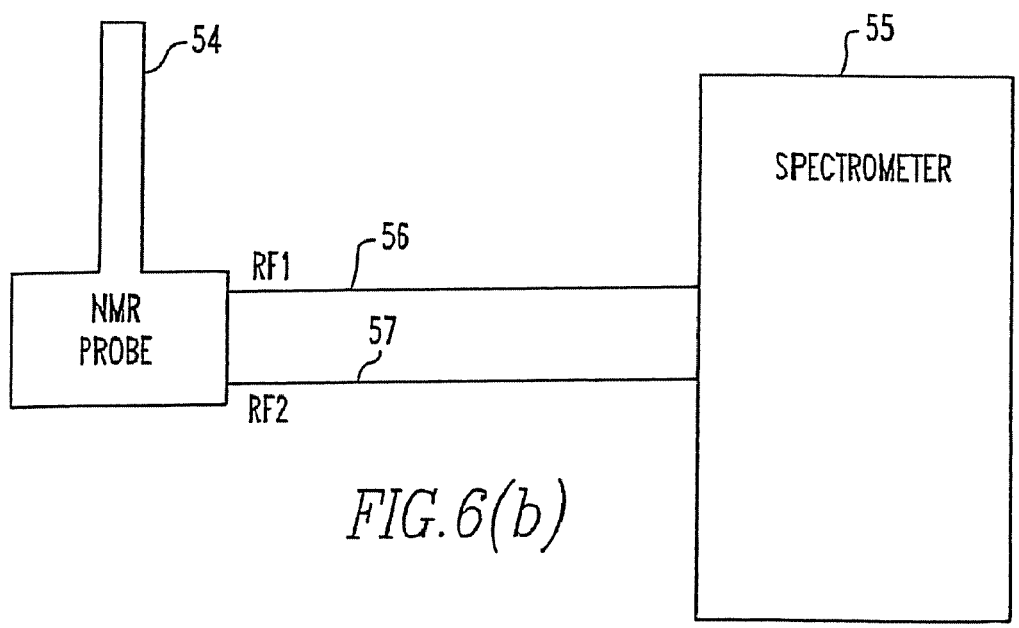

The preferred embodiments of the present invention are hereinafter described with reference to the accompanying drawings. FIGS. 6(a) and 6(b) show an NMR apparatus according to one embodiment of the present invention. FIG. 6(a) is a circuit diagram, and FIG. 6(b) shows the relation between the NMR probe and the spectrometer.

The apparatus has an NMR detection coil 33. Where the coil 33 is of the saddle-type as shown in FIGS. 4(a)-4(d), a cylindrical winged portion of coil foil 37, a coil bobbin 32 made of a cylindrical dielectric, and a cylindrical conductor 39 in the form of a cylindrical band form two capacitors 43 and 44 as shown in FIG. 6(a). A cylindrical annular portion of the coil foil 37 and two vertical band portions form two inductors 41 and 42, thus forming an LC resonator capable of resonating with RF signals.

A first tuning-and-matching circuit for matching to a first RF frequency RF1 necessary for measurement of NMR signals and a second tuning-and-matching circuit for matching to a second RF frequency RF2 that do not affect the measurement of NMR signals and hence is unnecessary for the measurement are connected with the NMR detection coil 33. The tuning and matching to the frequency RF1 are done using two variable capacitors 46 and 47. The tuning and matching to the frequency RF2 are performed using two variable capacitors 45 and 48.

The NMR detection coil 33 is grounded at point a because a resonance mode (indicated by arrows 51 and 52) at the frequency RF2 is prepared for the NMR detection coil 33, as well as the resonance mode (indicated by arrows 49 and 50) at the measurement frequency RF 1 for measurement of NMR signals. The arrows 49 and 50 indicate the senses of RF currents when they maximize. Similarly, the arrows 51 and 52 indicate the senses of RF currents when they maximize. The resonance mode at the frequency RF2 is different from the resonance mode at the measurement frequency RF1 for NMR signals and does not affect the measurement.

A spectrometer 55 and an NMR probe 54 are connected by RF cables 56 and 57 that carry the RF1 and RF2, respectively. A control means is incorporated in the spectrometer 55 to control two power application means of RF1 and RF2 such that the sum of the RF power applied to the NMR detection coil from the power application means of RF1 and the RF power applied to the coil from the power application means of RF2 is kept constant.

In this configuration, where the NMR detection coil is resonating with the frequency of RF1, if the RF currents are maximized, the RF currents flowing through the two vertical band portions of the NMR detection coil 33 are opposite in sense as indicated by the arrows 49 and 50. Therefore, an RF magnetic field is produced inside the detection coil 33, permitting NMR measurements. At this time, parts of the RF currents are converted into heat due to electrical resistance. This increases the temperature of the detection coil 33.

On the other hand, where the NMR detection coil is resonating with the frequency of RF2, if the RF currents are maximized, the RF currents flowing through the two vertical band portions of the detection coil 33 are the same in sense as indicated by the arrows 51 and 52. Therefore, no RF magnetic field is set up in the coil 33. Hence, NMR measurements cannot be performed. However, this case is the same as the case of RF1 only in that the RF currents are partly converted into heat due to electrical resistance. Again, the temperature of the NMR detection coil 33 rises.

FIGS. 7(a), 7(b), and 7(c) schematically show the electric power of RF1 applied to the NMR detection coil, and the electric power of RF2. FIG. 7(d) shows the temperature variations of the coil. FIG. 7(a) indicates an example of the electric power of RF1 applied to the NMR detection coil. In this example, six RF pulses having different magnitudes are applied to the coil for a period on the order of tens of milliseconds. An NMR signal, known as a FID signal, is detected after a lapse of a given time from the application of the RF pulse sequence. The FID signal is detected for about 0.5 second after the application of the RF pulse sequence.

FIG. 7(b) shows an example of electric power of RF2 applied to the NMR detection coil together with the power of RF1. In this example, convexly protruding, pulsed power of RF1 is applied to the NMR detection coil. At the same time, electric power corresponding to the pulsed power of RF1 is subtracted from the power of RF2 during a period corresponding to the pulse width of RF1, and power of this reduced RF2 is applied to the detection coil.

Specifically, electric power of RF2 that does not affect measurement of NMR signals and thus is unnecessary for the measurement is applied to the detection coil complementarily during the period in which electric power of RF1 necessary for the measurement is not being applied to the coil. The total amount of RF power applied to the coil is so controlled that it does not substantially vary irrespective of whether the power of RF1 necessary for the measurement is being applied or not.

In this way, the RF power output of RF2 is made to have the concave portion such that the RF power intensity during the time when RF1 is being applied is equal to the RF power intensity during the time when RF1 is not being applied.

Consequently, the power of RF2 acts complementarily as a dummy of the power of RF 1. Therefore, as shown at the third stage of FIG. 7(c) as viewed from above, the sum of the power of RF1 and the power of RF2 does not vary irrespective of whether the pulsed power of RF1 is being applied or not.

As a result, the amount of RF power converted into heat due to the electrical resistance of the NMR detection coil does not vary irrespective of whether the pulsed power of RF1 is being applied to the detection coil or not. The temperature of the detection coil 33 is kept constant as shown in the bottom of FIG. 7(d).

The NMR detection coil 33 is heated by the power of RF2 instead of using the temperature-controlling heater 100. Therefore, the coil heats itself in response to the power of RF2. As a consequence, the response time is much shorter than in the case where the detection coil 33 is heated by the temperature-controlling heater 100. As a result, an NMR apparatus can be provided in which the temperature of the NMR detection coil hardly varies if pulsed power of RF1 is applied to the coil during NMR measurements.

Figure 8A:
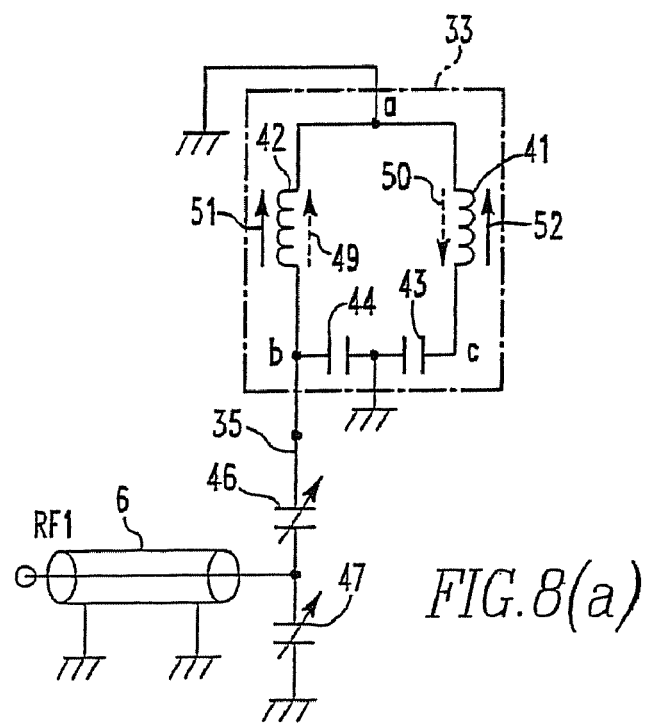
FIGS. 8(a) and 8(b) are diagrams illustrating an NMR apparatus according to another embodiment of the present invention.
Figure 8B:
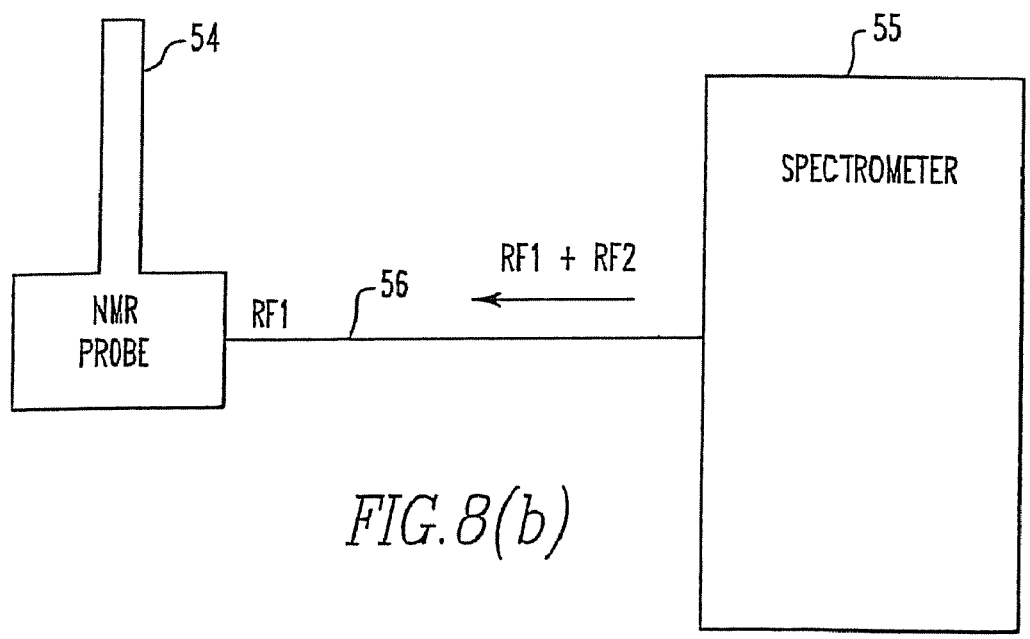

In the embodiment of FIG. 6(b), the spectrometer 55 and NMR probe 54 are connected by the two RF cables 56 and 57 that carry RF1 and RF2, respectively. This configuration may be replaced by the structure shown in FIG. 8(b). That is, only a port tuned and matched to the frequency of RF1 is used. This port is so constructed that it can also be tuned and matched to the frequency RF2. In this case, the input port for RF2 and variable capacitors 45 and 48 are unnecessary. Electric power of frequency RF1 necessary for NMR measurement and power of frequency RF2 necessary for the NMR measurement can be applied using only one RF cable 56. In this modified embodiment, RF1 and RF2 resonate in different resonant modes in the NMR detection coil 33 in the same way as in the case of FIGS. 6(a) and 6(b).

Figure 9A:
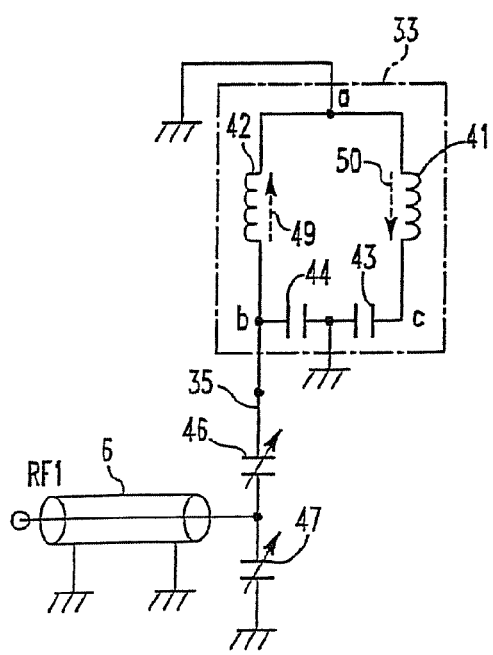
FIGS. 9(a)-9(c) are diagrams illustrating an NMR apparatus according to a further embodiment of the present invention.

In another modified embodiment in which only the input port for RF1 is used and the input port for RF2 and variable capacitors 45, 48 are omitted, only the resonance mode at RF1 of the NMR detection coil 33 may be utilized as shown in FIG. 9(a), where the arrows 49 and 50 indicate the resonance mode, i.e., the senses of RF currents when they maximize.

Figure 9B:
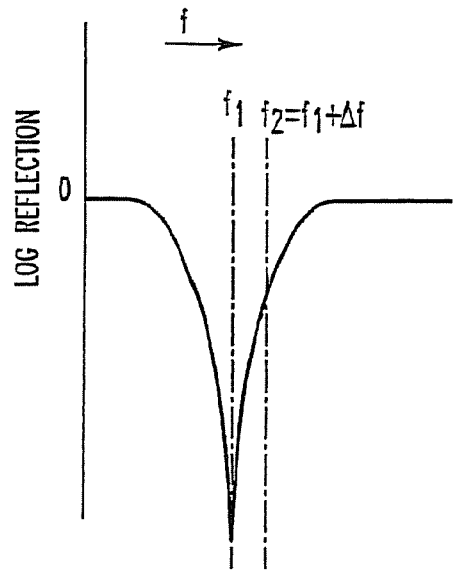
Figure 9C:
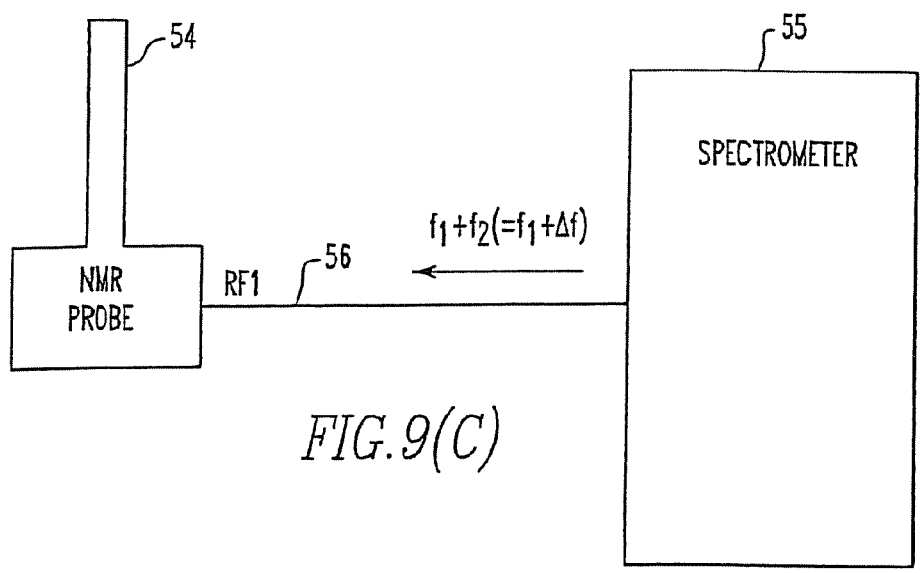

Measurement of the vicinities of the resonance mode at RF1 of the NMR detection coil 33 by the use of a network analyzer has produced reflection characteristics as shown in FIG. 9(b). In this figure, the frequency is plotted on the horizontal axis, while the reflection power is on the vertical axis. In normal NMR measurements, the RF1 is tuned to a frequency $f_1$ at which the reflection power is lowest. Since the frequency range in which the reflection power is low is considerably wide, the detection coil 33 can be sufficiently resonated at a frequency $f_2$ shifted from the $f_1$ by a frequency $\Delta f$ in the same resonance mode as the resonance mode at RF1. The arrows 49 and 50 indicate the senses of RF currents when they maximize. At the frequency $f_2$, the NMR measurements are not affected.

Accordingly, temperature control of the NMR detection coil 33 can be provided as shown in FIG. 7(d) by preparing the second frequency $f_2$ which is shifted from the measurement frequency $f_1$ for NMR by frequency differences $\Delta f$, i.e., $f_2$ is close to $f_1$, and at which NMR measurements are not affected. In addition to the $f_1$, using the $f_2$ as RF power playing the same role as the RF2 in FIG. 7(b), and using only the input port for RF1 and resonance mode at RF1.

In this modified embodiment, $f_1$ and $f_2$ resonate in the same RF1 resonance mode (indicated by the arrows 49 and 50 indicating the senses of RF currents when the currents maximize) in the NMR detection coil 33. In this respect, this modified embodiment is fundamentally different from the modified embodiment of FIGS. 8(a) and 8(b).

Figure 10:
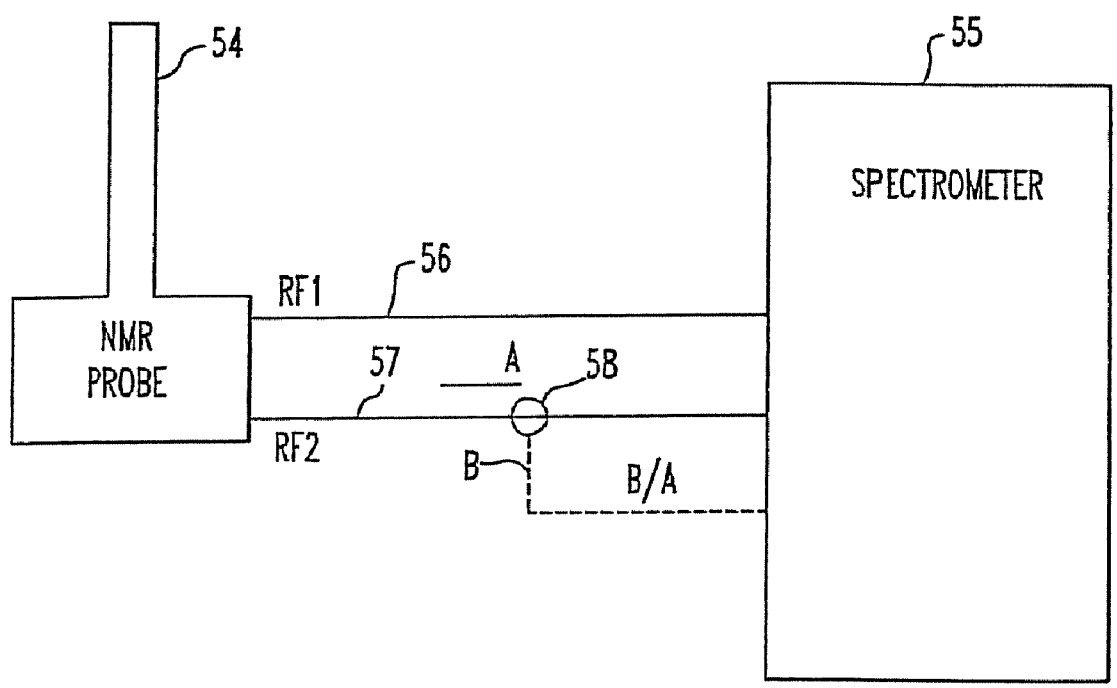
FIG. 10 is a diagram illustrating an NMR apparatus according to still another embodiment of the present invention.

FIG. 10 shows another NMR apparatus according to the present invention. This apparatus has an NMR probe 54 and a spectrometer 55 which are connected by RF cables 56 and 57 carrying RF1 and RF2, respectively.

A power meter 58 is inserted in the RF cable 57 that carries the RF2. RF input power A applied to the NMR probe 54 and RF power B reflected from the NMR probe 54 are measured. The power of RF2 is adjusted.

The RF1 and RF2 are adjusted in the manner described now. RF power of about 5 W, for example, is first applied at the frequency of RF2. Tuning and matching are performed to make zero the reflected power. In this way, the RF power of 5 W is constantly applied to the NMR detection coil. The temperature of the detection coil is in equilibrium at some temperature T. Then, RF power of about 1 mW, for example, which seems to hardly affect the temperature of the detection coil, is applied at the frequency RF1. Tuning and matching are done to make zero the reflected power.

Then, the method already described in connection with FIGS. 7(a)-7(d) is implemented. That is, the sum of the power of RF1 and the power of RF2 is kept constant. RF power is output such that the total amount of heat produced from the detection coil and the surroundings is maintained constant. However, after a lapse of some time, if an adjustment error occurs, the temperature of the NMR detection coil rises.

If the temperature of the NMR detection coil rises, the electrical resistance of the coil increases and the Q value decreases, then the RF2 deviates from the matching condition and the reflected power of RF2 increases. Accordingly, the ratio of the RF power A applied to the NMR probe 54 to the RF power B reflected from the probe 54 is detected by the power meter 58. If the ratio B/A increases, it is judged that the temperature of the detection coil has increased. The amplitude of the output power of RF2 is readjusted to minimize the ratio B/A.

In this method, the temperature rise of the NMR detection coil can be detected from the Q value of the detection coil rather than from the thermometer. Therefore, the temperature rise can be detected directly without being affected by thermal resistance and thermal capacity existing between the detection coil and thermometer.

This method can be applied to any NMR apparatus using the second frequency not affecting NMR measurements, such as the NMR apparatus shown in FIGS. 6(a) and 6(b), FIGS. 8(a) and 8(b), and FIGS. 9(a) and 9(b).

In this way, if NMR measurements are performed for a long time, the total amount of heat generated from the NMR detection coil and its surroundings can be controlled to be constant at all times.

Figure 11A:
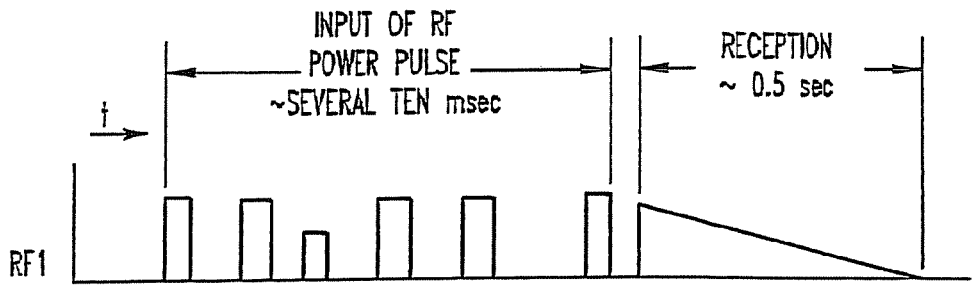
FIGS. 11(a)-11(d) are time cycle diagrams illustrating an NMR apparatus according to an additional embodiment of the present invention.

FIGS. 11(a)-11(d) show a modified embodiment illustrating the power of RF1 applied to the NMR detection coil, the power of RF2, and temperature variations of the detection coil. FIG. 11(a) indicates one example of electric power of RF1 applied to the detection coil. In this example, six RF pulses of different magnitudes are applied to the detection coil for a period on the order of tens of milliseconds. After a lapse of a given time from the application of the RF pulse sequence, an NMR signal (FID signal) is detected for a period of about 0.5 second from the application.

Figure 11B:
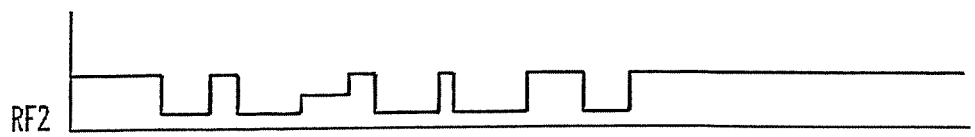
Figure 11C:
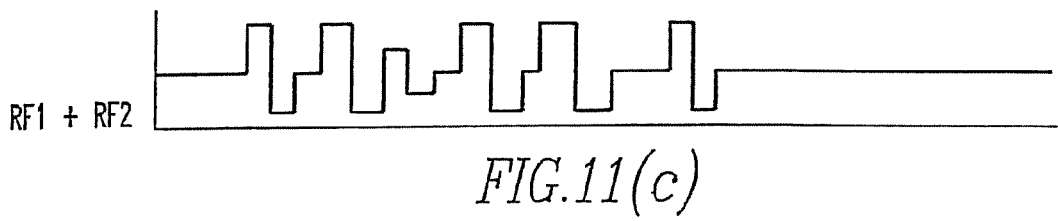
Figure 11D:
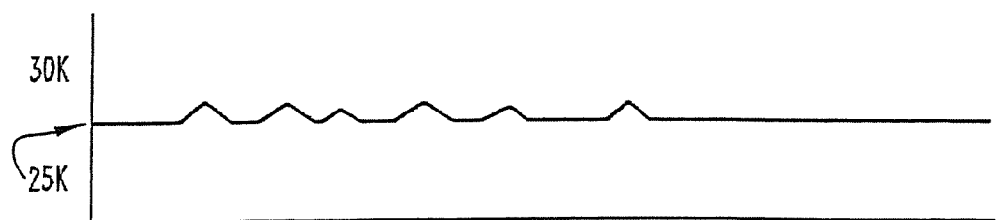

FIG. 11(b) shows one example of the electric power of RF2 applied to the NMR detection coil together with the power of RF1. In this example, pulsed power of RF1 is applied to the detection coil. At the same time, the power of RF2 of intensity weaker than that of RF1 is subtracted from the steady value of the power of RF2, and this differential power is applied to the detection coil for a period longer than the period corresponding to the pulse width of the pulsed power of RF1.

More specifically, at the frequency RF1, a short and strong RF power is applied. On the other hand, at the frequency RF2, a long and short RF power is subtracted from the steady value of the RF2, and the differential power is applied. As a result, shown in FIG. 11(d), the temperature of the detection coil rises temporarily but the temperature of the detection coil is controlled to be constant during a short period (e.g., less than 0.1 millisecond) that does not affect NMR signals.

Consequently, the maximum power at the frequency RF2 can be set much lower than the maximum power at the frequency RF1. The thermal load on the cryocooler that cools the NMR detection coil can be alleviated.

Figure 12A:
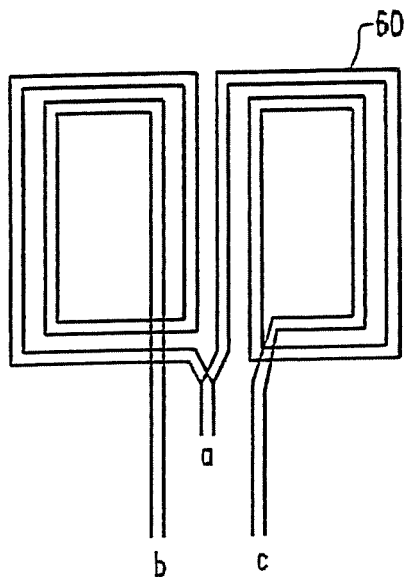
FIGS. 12(a)-12(c) illustrate an NMR apparatus according to yet another embodiment of the present invention.
Figure 12B:
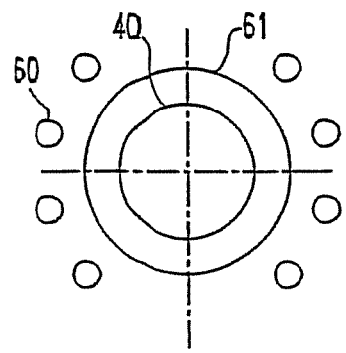
Figure 12C:
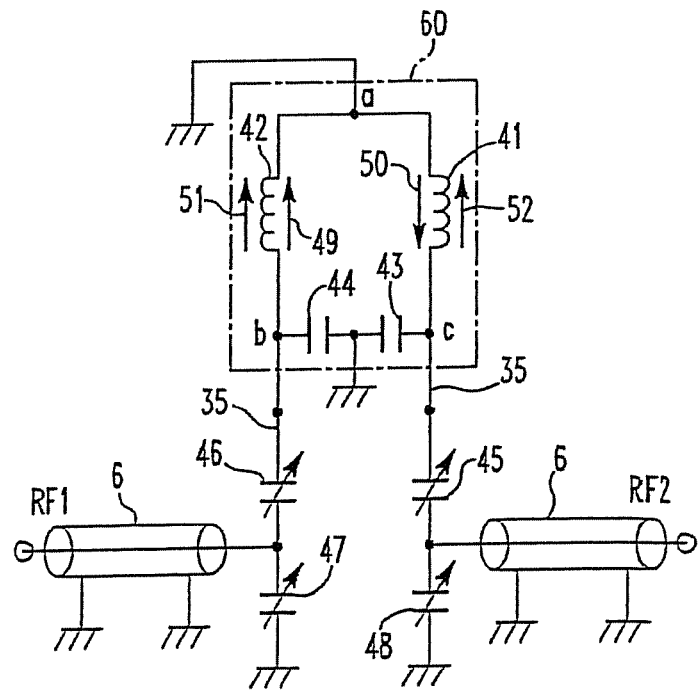

FIGS. 12(a)-12(c) show another NMR apparatus according to the present invention. FIG. 12(a) is an expanded view of the NMR detection coil. FIG. 12(b) is a cross-sectional view of the coil. FIG. 12(c) is a circuit diagram.

The NMR detection coil, indicated by numeral 60, consists of coil wire wound around a coil bobbin 61. In this embodiment, a saddle coil fabricated by winding a wire is used instead of the saddle coil (FIGS. 4(a)-4(d)) fabricated from foil. The NMR measurement method according to the present invention can be applied to this NMR detection coil in the same way as in the above-described embodiments.

Figure 13A:
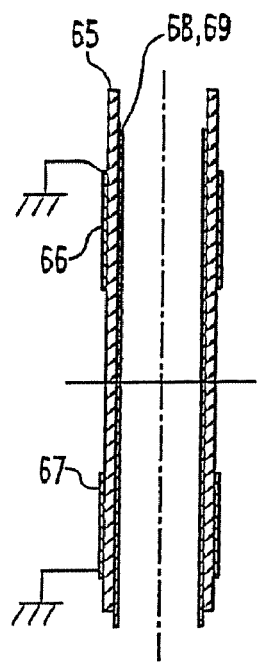
FIGS. 13(a)-13(c) illustrate an NMR apparatus according to a still further embodiment of the present invention.
Figure 13B:
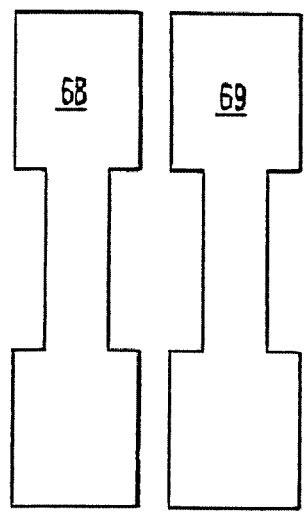
Figure 13C:
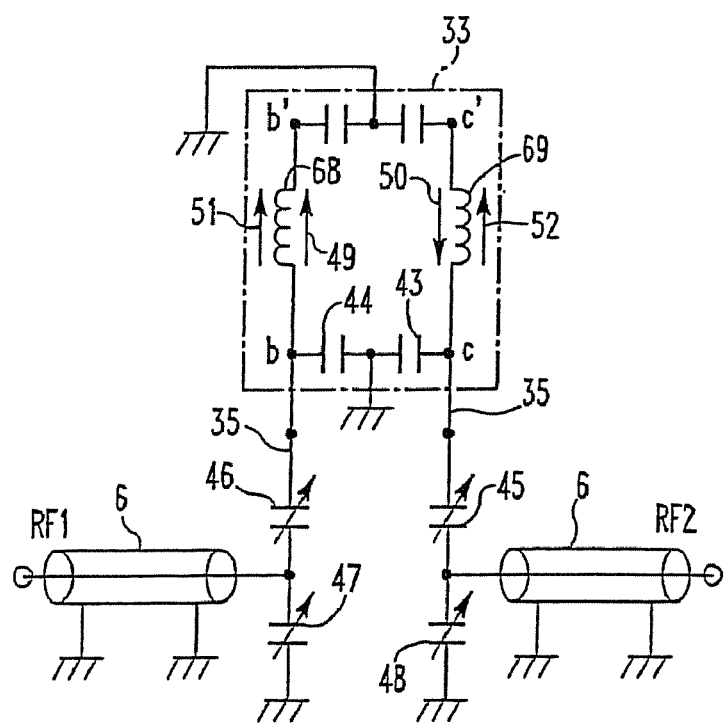

FIGS. 13(a) and 13(b) show a further NMR apparatus according to the present invention. FIG. 13(a) is an expanded view of the NMR detection coil, and FIG. 13(c) is a circuit diagram.

The NMR detection coil, indicated by numeral 33, is an Alderman-Grant coil (resonator coil) instead of the saddle coil shown in FIGS. 4(a)-4(d). This resonator coil is fabricated by placing H-shaped coil foil 68 on the inside of a dielectric bobbin 65 and placing cylindrical conductors 66 and 67 on the outside of the bobbin 65. The NMR measurement method according to the present invention can also be applied to this NMR detection coil in the same way as in the above-described embodiments.

In FIG. 13(a), the cylindrical conductors 66 and 67 are grounded for the following reason. A resonance mode (indicated by the arrows 49 and 50) at the measurement frequency RF1 for NMR signals is prepared for the NMR detection coil 33. The arrows 49 and 50 indicate the senses of RF currents when they maximize. In addition, a second resonance mode (indicated by the arrows 51 and 52) at frequency RF2 that does not affect the measurement of NMR signals is prepared for the detection coil 33, the second resonance mode being different from the first-mentioned mode at RF1. The arrows 51 and 52 indicate the senses of RF currents when they maximize.

Figure 14:
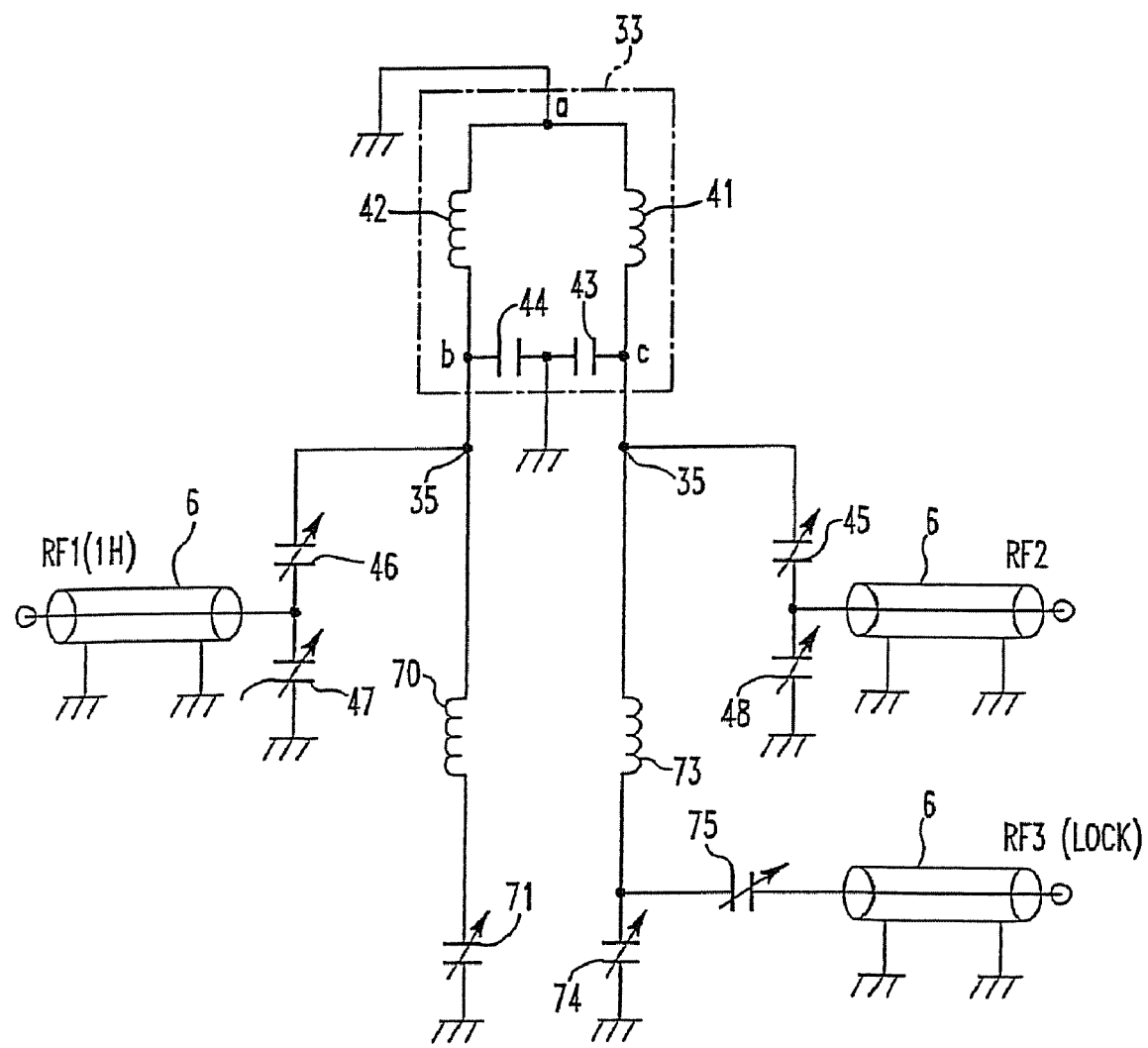
FIG. 14 is a diagram illustrating an NMR apparatus according to a still additional embodiment of the present invention.

FIG. 14 shows still another NMR apparatus according to the present invention. Where this NMR detection coil, indicated by reference numeral 33, is a saddle coil as shown in FIGS. 4(a)-4(d), a cylindrical winged portion of coil foil 37, a coil bobbin 32 made of a cylindrical dielectric, and a cylindrical conductor 39 in the form of a cylindrical band form two capacitors 43 and 44 as shown in of FIG. 6(a). The cylindrical annular portion of the coil foil 37 and the two vertical band portions form two inductors 41 and 42. Consequently, an LC resonator capable of resonating with RF signals is formed.

A tuning-and-matching circuit for high frequency RF1 necessary for measurement of NMR signals and a tuning-and-matching circuit for high frequency RF2 that does not affect the measurement of NMR signals and thus are unnecessary for the measurement are connected with the NMR detection coil 33. Tuning and matching at the frequency RF1 are done using two variable capacitors 46 and 47. Tuning and matching at the frequency RF2 are performed using two variable capacitors 45 and 48.

In this embodiment, a respective one end of coils 73 and 70 is connected with each of the two inductors 41 and 42. The other end of the coil 73 is grounded via a variable capacitor 74. The other end of the coil 70 is grounded via a capacitor 71. A third RF wave RF3 that induces resonance with deuterium nuclei ($^2D$) is injected into the junction of the coil 73 and variable capacitor 74 via a matching variable capacitor 75.

In this embodiment, RF1 is the RF wave for observation of hydrogen nuclei ($^1H$). On the other hand, RF2 corresponds to a dummy RF wave used to control the temperature of the NMR detection coil. RF3 corresponds to the RF wave for locking used to compensate for drift in the static magnetic field in the NMR apparatus. A locking resonator circuit for resonating RF3 is composed of capacitor 71, coil 70, NMR detection coil 33, coil 73, and variable capacitors 74, 75.

Also, in this embodiment, pulsed power of RF1 protruding convexly is applied to the NMR detection coil. At the same time, power corresponding to the pulsed power of RF1 is subtracted from the power of RF2, and this reduced power of RF2 is applied to the detection coil during a period corresponding to the pulse width of the RF1 pulse.

In this way, the RF output power of the frequency RF2 is made to have a convex portion. As a result, the RF power intensity during the period in which RF1 is being applied is made equal to the RF power intensity during the period in which it is not.

Thus, the power of RF2 acts complementarily as a dummy of the power of RF1. The sum of the power of RF1 and the power of RF2 is constant irrespective of whether pulsed power of RF1 is being applied or not. As a result, the amount of RF power converted into heat by the electrical resistance of the NM detection coil is constant regardless of whether the pulsed power of RF1 is being applied to the detection coil or not. The temperature of the detection coil 33 is kept constant.

In this embodiment, RF3 for locking is applied to the NMR detection coil, in addition to RF1 and RF2. RF1 is at a power level of tens of watts to more than one hundred watts. In contrast, RF3 is only at a power level on the order of milliwatts and hardly affects the temperature of the NMR detection coil. Accordingly, it is not necessary to control the RF2 so as to complement the period in which the RF3 is interrupted. RF3 can be neglected.

In the description of the above embodiments, the NMR apparatus uses only one wave as the RF wave for observing an NMR signal. Obviously, the invention can be applied to an NMR apparatus using two RF waves HF and LF to observe an NMR signal or an NMR apparatus providing an RF irradiation system.

In particular, where the invention is applied to an NMR apparatus using two RF waves HF and LF for observing an NMR signal, the applied power of RF2 may be recessed at the timings of pulsed power of HF and pulsed power of LF.

Furthermore, where the invention is applied to an NMR apparatus providing an RF irradiation system, the power of RF2 may also be applied to an RF irradiation coil of the probe in the same manner.

Furthermore, the invention can be applied to a multiple-tuning NMR apparatus using three or more RF waves for observing an NMR signal. The applied power of RF2 may be recessed at the timings of the application of each RF pulse.

As described so far, according to the NMR measurement method of the present invention, RF power of a frequency not affecting measurement of NMR signals is applied to the detection coil complementarily. The average value of the sum of RF powers applied to the detection coil is kept almost constant irrespective of whether the RF power of the frequency necessary for the measurements of NMR signals is applied or not. Therefore, an NMR measurement method can be offered in which the temperature of the detection coil hardly varies if pulsed RF power is applied to the NMR detection coil during NMR measurements.

Furthermore, the NMR apparatus of the present invention comprises a detection coil, first RF power application means for applying RF power of a frequency necessary for measurements of NMR signals to the detection coil, second RF power application means for applying RF power of a frequency not affecting the measurements of NMR signals to the detection coil, and control means for controlling the two RF power application means to maintain almost constant the average value of the sum of the RF power applied to the coil from the first RF power application means and the RF power applied to the coil from the second RF power application means. Therefore, an NMR apparatus can be offered in which the temperature of the detection coil hardly varies if pulsed RF power is applied to the detection coil during NMR measurements.

Having thus described our invention with the detail and particularity required by the Patent Laws, what is desired protected by Letters Patent is set forth in the following claims.

The invention claimed is:

1. An NMR measurement method comprising the steps of:
placing an RF power meter on the cable connected between an RF power source and an NMR detection coil or an RF irradiation coil;
applying RF power of a frequency not affecting measurement of an NMR signal from an NMR specimen to either a detection coil or the RF irradiation coil such that reflected RF power is produced and measured by the RF power meter; and
detecting an increase in the temperature of the detection coil or the RF irradiation coil from the strength of the measured reflected RF power.

2. The NMR measurement method set forth in claim 1, wherein said detection coil or the RF irradiation coil has a resonance mode which is different from a resonance mode at a measurement frequency for the NMR signal and which does not affect the measurement of the NMR signal.

3. The NMR measurement method set forth in claim 1, wherein said frequency not affecting the measurement of the NMR signal is shifted from a measurement frequency for the NMR signal by a given frequency and can resonate in the same resonance mode as the measurement frequency for the NMR signal.

4. The NMR measurement method of claim 1, wherein the RF power of the frequency not affecting the measurement of the NMR signal can be so adjusted that the ratio of the RF power reflected from the detection coil or the RF irradiation coil to the RF power applied to the detection coil or the RF irradiation coil is minimized.

* * * * *